(12) United States Patent
Kim et al.

(10) Patent No.: US 10,877,599 B2
(45) Date of Patent: Dec. 29, 2020

(54) TOUCH SENSING UNIT AND DISPLAY DEVICE INCLUDING THE SAME

(71) Applicant: SAMSUNG DISPLAY CO., LTD., Yongin-si (KR)

(72) Inventors: Ilnam Kim, Hwaseong-si (KR); Kyungtea Park, Seoul (KR); Wonsang Park, Yongin-si (KR); Eunjin Sung, Yongin-si (KR); Keumdong Jung, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/135,501

(22) Filed: Sep. 19, 2018

(65) Prior Publication Data

US 2019/0250764 A1 Aug. 15, 2019

(30) Foreign Application Priority Data

Feb. 14, 2018 (KR) .................. 10-2018-0018120

(51) Int. Cl.
  *G06F 3/041* (2006.01)
  *H01L 27/32* (2006.01)
  *G06F 3/044* (2006.01)
  *G06K 9/00* (2006.01)

(52) U.S. Cl.
  CPC ............ *G06F 3/0418* (2013.01); *G06F 3/044* (2013.01); *G06K 9/0002* (2013.01); *H01L 27/323* (2013.01); *H01L 27/3234* (2013.01); *H01L 27/3244* (2013.01)

(58) Field of Classification Search
  CPC ...... G06F 3/044; G06F 3/0446; G06F 3/0418; H01L 27/323; H01L 27/3234; H01L 27/3244

See application file for complete search history.

(56) References Cited

U.S. PATENT DOCUMENTS

| 9,223,425 | B1* | 12/2015 | Kim ..................... G06F 3/0412 |
| 2011/0210927 | A1* | 9/2011 | Mizuhashi ............ G06F 3/044 345/173 |
| 2013/0050116 | A1* | 2/2013 | Shin ..................... G06F 3/044 345/173 |

(Continued)

FOREIGN PATENT DOCUMENTS

| KR | 101210473 | 12/2012 |
| KR | 1020170102668 | 9/2017 |

(Continued)

*Primary Examiner* — Dong Hui Liang
(74) *Attorney, Agent, or Firm* — F. Chau & Associates, LLC

(57) ABSTRACT

A touch sensing unit includes a base substrate and a plurality of sensing units disposed on the base substrate. A plurality of scan lines extend along a first direction and are arranged along a second direction that intersects the first direction. A plurality of output lines extend along the second direction and are arranged along the first direction. A first transmission line and a second transmission line are connected to the plurality of sensing units. The first transmission line receives a first transmission voltage. The second transmission line receives a second transmission voltage different from the first transmission voltage.

19 Claims, 11 Drawing Sheets

(56) References Cited

U.S. PATENT DOCUMENTS

| | | | |
|---|---|---|---|
| 2014/0139480 A1* | 5/2014 | Seo | G06F 3/044 |
| | | | 345/174 |
| 2016/0202797 A1* | 7/2016 | Cordeiro | G06F 3/044 |
| | | | 345/174 |
| 2016/0328075 A1* | 11/2016 | Luo | G06F 3/0416 |
| 2017/0168620 A1* | 6/2017 | Gim | G09G 3/3696 |
| 2017/0255806 A1 | 9/2017 | Kang et al. | |
| 2017/0270333 A1 | 9/2017 | Jeon et al. | |
| 2017/0336892 A1* | 11/2017 | Chang | G06F 3/0412 |
| 2017/0351364 A1* | 12/2017 | Kim | G06F 3/0416 |
| 2018/0247098 A1 | 8/2018 | Yoshii et al. | |

FOREIGN PATENT DOCUMENTS

| | | |
|---|---|---|
| KR | 1020170108264 | 9/2017 |
| KR | 1020180098443 | 9/2018 |

\* cited by examiner

TOUCH SENSING UNIT AND DISPLAY DEVICE INCLUDING THE SAME

CROSS-REFERENCE TO RELATED APPLICATION

This application claims priority under 35 U.S.C. § 119 to Korean Patent Application No. 10-2018-0018120, filed on Feb. 14, 2018, in the Korean Intellectual Property Office (KIPO), the disclosure of which is incorporated by reference herein in its entirety.

TECHNICAL FIELD

Exemplary embodiments of the present invention relate to a touch sensing unit, and more particularly, to a display device including the same.

DISCUSSION OF RELATED ART

Display devices include liquid crystal display ("LCD") devices, organic light emitting diode ("OLED") display devices, plasma display panel ("PDP") display devices or electrophoretic display devices.

In addition to the function of displaying images, display devices may have a touch sensing function and a fingerprint recognition function.

The touch sensing may be classified into a capacitive type, an optical type, a thermal type, or an ultrasonic type, for example. The capacitive type is a method of recognizing a fingerprint by sensing a capacitance difference based on a distance between a ridge and a valley of the fingerprint using sensing electrodes.

A sensing unit for sensing fingerprints may include an element such as a thin film transistor, and such an element may have different characteristics depending on its position due to process dispersion and changes of external environment.

SUMMARY

Exemplary embodiments of the present invention provide a touch sensing unit uniformly compensating for variations in touch detection sensitivity of different sensing units of the touch sensing unit, which may arise as a result of different positions of the different touch sensing units. For example, touch sensing characteristics at different positions of a touch sensing unit may vary according to driving time, light or temperature. Thus, the touch sensing unit according to an exemplary embodiment of the present invention provides reliable touch driving and increased touch detection accuracy. Exemplary embodiments of the present invention provide a display device including the touch sensing unit.

According to an exemplary embodiment of the present invention, a touch sensing unit includes a base substrate and a plurality of sensing units disposed on the base substrate. A plurality of scan lines extend along a first direction and are arranged along a second direction that intersects the first direction. A plurality of output lines extend along the second direction and are arranged along the first direction. A first transmission line and a second transmission line are connected to the plurality of sensing units. The first transmission line receives a first transmission voltage. The second transmission line receives a second transmission voltage different from the first transmission voltage.

Each of the first transmission voltage and the second transmission voltage may have a different value depending on a position of a sensing unit of the plurality of sensing units.

The base substrate may include a first area and a second area adjacent to the first area along the first direction. At least one of the plurality of sensing units is disposed in each of the first area, and the second area.

The sensing unit disposed in the first area may be connected to the first transmission line and may receive the first transmission voltage. The sensing unit disposed in the second area may be connected to the second transmission line and may receive the second transmission voltage.

The base substrate may include a third area adjacent to the first area along the second direction. at least one of the plurality of sensing units may be disposed in the third area.

The sensing unit disposed in the first area and the sensing unit disposed in the third area may be connected to the first transmission line and may receive the first transmission voltage.

The first transmission voltage applied to the sensing unit disposed in the first area may have a value different from a value of the second transmission voltage applied to the sensing unit disposed in the second area.

The plurality of scan lines may receive a scan signal sequentially along the second direction. The first transmission voltage that is applied to the sensing unit disposed in the first area when the scan signal is applied to the sensing unit disposed in the first area may have a value different from a value of the first transmission voltage that is applied to the sensing unit disposed in the second area when the scan signal is applied to the sensing unit disposed in the third area.

Each of the plurality of sensing units may include a thin film transistor.

The touch sensing unit may include a dummy scan line disposed adjacent to the plurality of scan lines and extending along the first direction. A dummy output line may be disposed adjacent to the plurality of output lines and may extend along the second direction. A dummy sensing unit may be connected to the dummy scan line and the dummy output line.

The dummy sensing unit may detect a driving current that varies depending on driving time, light or temperature.

According to an exemplary embodiment of the present invention, a display device includes a display unit and a touch sensing unit disposed on the display unit. The touch sensing unit includes a base substrate. A plurality of sensing units are disposed on the base substrate. A plurality of scan lines extend along a first direction and are arranged along a second direction that intersects the first direction. A plurality of output lines extend along the second direction and are arranged along the first direction. A first transmission line and a second transmission line are connected to the plurality of sensing units. The first transmission line receives a first transmission voltage. The second transmission line receives a second transmission voltage different from the first transmission voltage.

Each of the first transmission voltage and the second transmission voltage may have a different value depending on a position of the sensing units of the plurality of sensing units.

The base substrate may include a first area and a second area adjacent to the first area along the first direction. at least one of the plurality of sensing units is disposed in each of the first area, and the second area.

The sensing unit disposed in the first area may be connected to the first transmission line and may receive the first transmission voltage. The sensing unit disposed in the second area may be connected to the second transmission line and may receive the second transmission voltage.

The first transmission voltage applied to the sensing unit disposed in the first area may have a value different from a value of the second transmission voltage applied to the sensing unit disposed in the second area.

Each of the plurality of sensing units may include a thin film transistor.

The display device may include a dummy scan line disposed adjacent to the plurality of scan lines and extending along the first direction. A dummy output line may be disposed adjacent to the plurality of output lines and may extend along the second direction.

The display device may include a dummy sensing unit connected to the dummy scan line and the dummy output line.

The dummy sensing unit may detect a driving current that varies depending on driving time, light or temperature.

BRIEF DESCRIPTION OF THE DRAWINGS

A more complete appreciation of the present invention will become more apparent by describing in detail embodiments thereof with reference to the accompanying drawings, in which.

DETAILED DESCRIPTION

Figure 1:
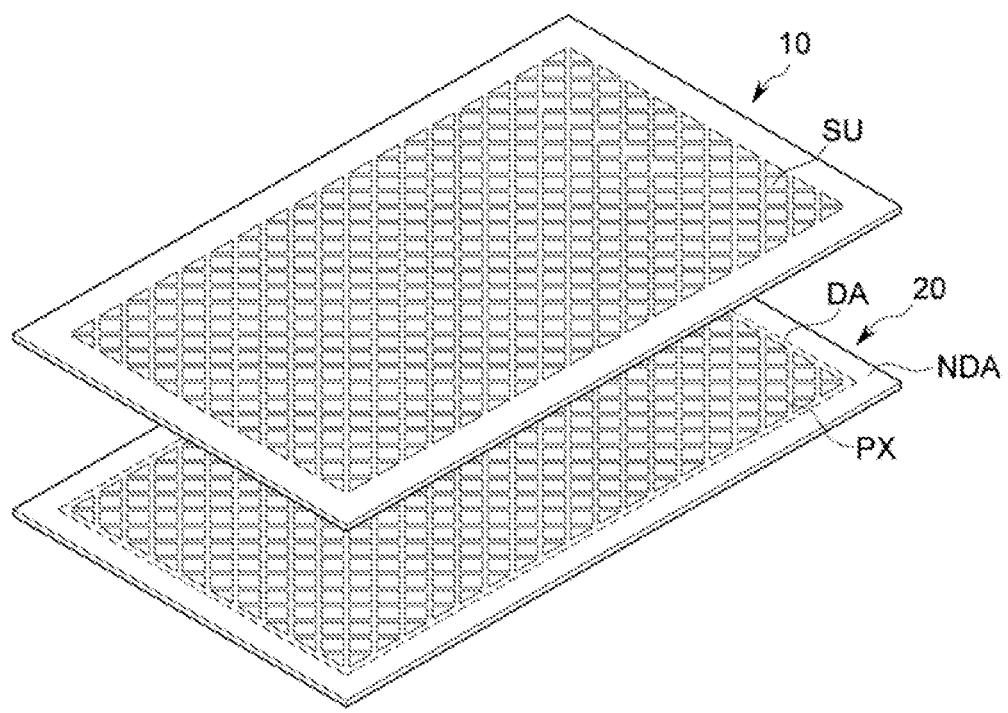
FIG. 1 is a perspective view of a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein. Like reference numerals may refer to like elements throughout the specification and drawings.

In the drawings, thicknesses of layers (e.g., of a plurality of layers) and areas may be exaggerated for clarity of description. It will be understood that when a component, such as a layer, a film, a region, or a plate, is referred to as being "on" another component, the component may be directly on the other component or intervening components may be present.

Throughout the specification, when an element is referred to as being "connected" to another element, the element may be "directly connected" to the other element, or "electrically connected" to the other element with one or more intervening elements interposed therebetween.

It will be understood that although the terms "first" and "second" may be used herein to describe various components, these components should not be limited by these terms.

"About" or "approximately" as used herein is inclusive of the stated value and means within an acceptable range of variation for the particular value as determined by one of ordinary skill in the art, considering the measurement in question and the error associated with measurement of the particular quantity (i.e., the limitations of the measurement system). For example, "about" may mean within one or more standard variations, or within ±30%, 20%, 10%, 5% of the stated value.

A touch sensing unit and a display device including the touch sensing unit will be described in more detail below with reference to FIGS. 1 to 5.

FIG. 1 is a perspective view of a display device according to an exemplary embodiment of the present invention.

Referring to FIG. 1, a display device may include a fingerprint sensing unit 10 and a display unit 20. The fingerprint sensor 10 may be disposed on the display unit 20. The fingerprint sensing unit 10 and the display unit 20 may be separately formed. Alternatively, the fingerprint sensing unit 10 and the display unit 20 may be integrally formed as a single structure. As an example, the display device will be described in more detail below in an arrangement in which the fingerprint sensing unit 10 has an on-cell structure in which it is directly disposed on the display unit 20. However, exemplary embodiments of the present invention are not limited thereto, and the fingerprint sensing unit 10 may have an in-cell structure in which it is formed in the display unit 20. The display device may be an organic light emitting diode ("OLED") display device, but exemplary embodiments of the present invention are not limited thereto, and the display device may be a liquid crystal display ("LCD") device. The fingerprint sensing unit 10 may be a touch sensing unit, as described herein, and thus the fingerprint sensing unit 10 may be interchangeably referred to as a touch sensing unit 10. The display unit 20 may include a display area DA and a non-display area NDA. The display unit 20 may include a plurality of pixels PX. The pixels may be arranged in a matrix form in the display area DA. The plurality of pixels PX may each have a substantially rhombic shape, but exemplary embodiments of the present invention are not limited thereto, and the plurality of pixels PX may have various shapes such as substantially circular or polygonal shapes. As an example, the non-display region NDA may be arranged at four sides of the display region DA in a plan view; however, exemplary embodiments of the present invention are not limited thereto. For example, the non-display region NDA may be arranged at less than four sides (e.g., three sides) of the display region DA in a plan view.

The fingerprint sensing unit 10 may be disposed on the display unit 20. The fingerprint sensing unit 10 may include a plurality of sensing units SU to detect whether a touch input occurs. The sensing units SU may detect touch coordinates, ridges and valleys of fingerprints. For example, the fingerprint sensing unit 10 may include a plurality of sensing units SU disposed over substantially an entire surface of the substrate that overlaps the display unit 20. Accordingly, a touch or a fingerprint may be sensed at any region over an entire surface of the display device. For example, the sensing units SU may be arranged to overlap substantially the entire display area DA along a direction orthogonal to an upper surface of the display unit 20.

Figure 2:
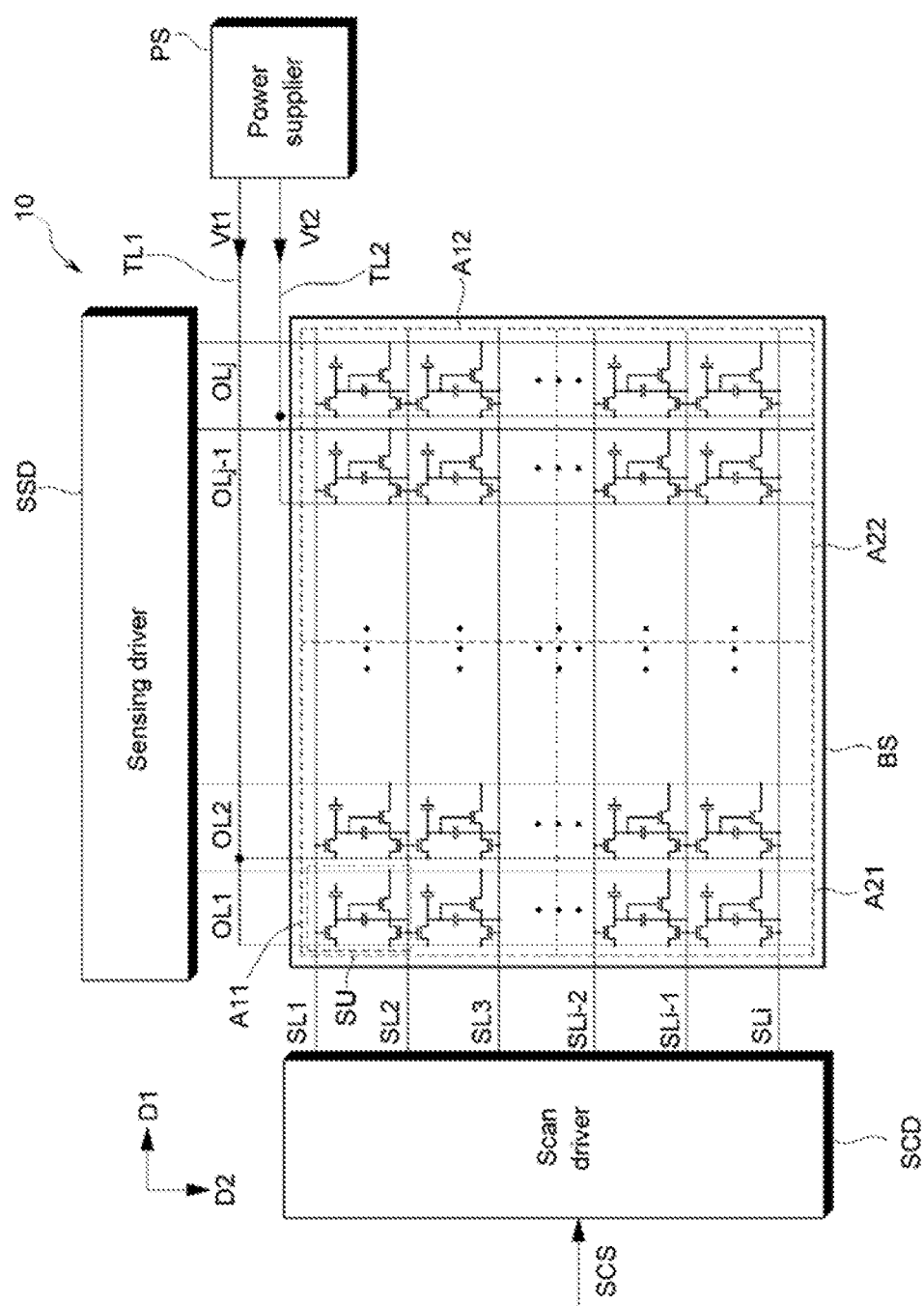
FIG. 2 is a block diagram of a touch sensing unit according to an exemplary embodiment of the present invention.

FIG. 2 is a block diagram of a touch sensing unit according to an exemplary embodiment of the present invention.

Referring to FIG. 2, the touch sensing unit 10 may include a base substrate BS, a scan driver SCD, a sensing driver SSD, and a power supply PS.

The touch sensing unit 10 may include "i" number of scan lines SL1 to SLi, "j" number of output lines OL1 to OLj, and two transmission lines TL1 and TL2, in which each of i and j are natural numbers greater than 1.

Each of the "i" number of scan lines SL1 to SLi may extend along the first direction D1 and may be arranged along a second direction D2 that intersects the first direction D1. As an example, the first direction may be perpendicular to the second direction. Each of the "j" number of output lines OL1 to OLj may extend along the second direction D2 and may be arranged along the first direction D1.

The scan lines SL1 to SLi may be insulated from and may intersect the output lines OL1 to OLj, respectively.

Each of the sensing units SU may be connected to either the first transmission line TL1 or the second transmission line TL2. In an exemplary embodiment of the present invention, the sensing units SU connected to the first transmission line TL1 may receive substantially a same voltage as each other, and the sensing units SU connected to the second transmission line TL2 may receive substantially a same voltage as each other, which will be described in more detail below with reference to FIGS. 4 and 5. The first voltage may be different from the second voltage.

The first to i-th scan lines SL1 to SLi may receive first to i-th scan signals, and the first and second transmission lines TL1 to TL2 may receive first and second transmission voltages Vt1 and Vt2.

The plurality of sensing units SU may be disposed on the base substrate BS in the form of a matrix along the first direction D1 and the second direction D2. For example, the plurality of sensing units SU may be arranged in a series of rows and columns extending along the first and second directions D1 and D2.

According to an exemplary embodiment of the present invention, the base substrate BS may include a plurality of areas. For example, the base substrate BS may include a first area A11, a second area A12, a third area A21, and a fourth area A22, for example. At least one sensing unit SU may be disposed in each area, which will be described in more detail below with reference to FIG. 4.

In an exemplary embodiment of the present invention, "j" number of sensing units SU arranged along an n-th horizontal line (e.g., which may be referred to herein as n-th horizontal line sensing units) may be individually connected to the first to j-th output lines OL1 to OLj, respectively. In addition, the n-th horizontal line pixels may be connected in common to the n-th scan line, in which n is one of 1 to i.

The n-th horizontal line sensing units may receive the n-th scan signal in common. For example, all of the "j" number of sensing units (e.g., sensing units SU arranged on a same horizontal line) may receive same scan signals, while sensing units located on different horizontal lines may receive different scan signals.

The sensing units SU may sense a change in current due to a touch, and may output a touch sensing signal to an output line connected to each sensing unit SU, which will be described in more detail below with reference to FIG. 3.

The scan driver SCD may generate scan signals according to a scan control signal SCS applied from the outside, and may sequentially apply the scan signals to the plurality of scan lines SL1 to SLi.

The scan driver SCD may include, for example, a shift register for shifting the start pulse according to a shift clock to generate scan signals. The shift register may include a plurality of switching elements.

The sensing driver SSD may receive the touch sensing signal output from the sensing unit SU. The sensing driver SSD may receive the touch sensing signal output from the sensing unit SU and may output the touch signal to the outside.

The first and second transmission voltages Vt1 and Vt2 output from the power supply PS may be provided to the sensing units SU through the first and second transmission lines TL1 and TL2, respectively.

According to an exemplary embodiment of the present invention, the sensing units SU may be connected to different transmission lines depending on the position of the sensing unit SU, which will be described in more detail below with reference to FIG. 4. In an exemplary embodiment of the present invention, the first transmission voltage Vt1 may be applied to the first transmission line TL1 and the second transmission voltage Vt2 may be applied to the second transmission line TL2.

According to an exemplary embodiment of the present invention, the first transmission voltage Vt1 may be different from the second transmission voltage Vt2.

According to an exemplary embodiment of the present invention, each of the first and second transmission voltages Vt1 and Vt2 may have a value that varies corresponding to a position in the second direction D2 of the sensing unit SU that receives the transmission voltage, which will be described in more detail below with reference to FIG. 5.

Figure 3:
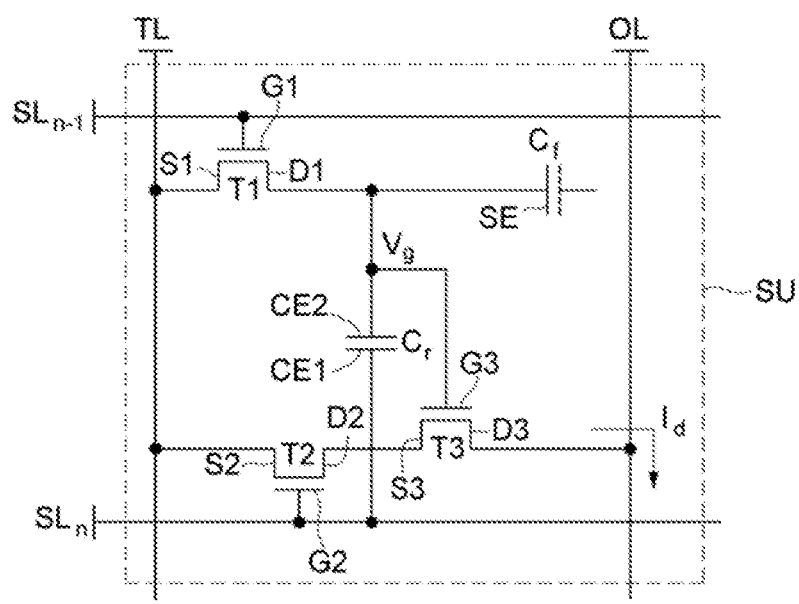
FIG. 3 is a configuration view of a sensing unit of FIG. 1.

FIG. 3 is a configuration view of a sensing unit of FIG. 1.

Referring to FIG. 3, the fingerprint sensing unit 10 may include a plurality of thin film transistors T1, T2, and T3, a plurality of wirings SLn−1, SLn, TL, an output line OL selectively connected to the plurality of thin film transistors T1, T2, and T3, and a reference capacitor Cr.

The plurality of thin film transistors T1, T2, and T3 include a first thin film transistor T1, a second thin film transistor T2, and a third thin film transistor T3.

A first gate electrode G1 of the first thin film transistor T1 may be connected to a first scan line SLn−1, a first source electrode S1 of the first thin film transistor T1 may be connected to a transmission line TL, and a first drain electrode D1 of the first thin film transistor T1 may be connected to a third gate electrode G3 of the third thin film transistor T3.

A second gate electrode G2 of the second thin film transistor T2 may be connected to a second scan line SLn, a second source electrode S2 of the second thin film transistor T2 may be connected to a transmission line TL, and a second drain electrode D2 of the second thin film transistor T2 may be connected to a third source electrode S3 of the third thin film transistor T3.

The third gate electrode G3 of the third thin film transistor T3 may be connected to the first drain electrode D1 of the first thin film transistor T1, the third source electrode S3 of the third thin film transistor T3 may be connected to the second drain electrode D2 of the second thin film transistor T2, and a third drain electrode D3 of the third thin film transistor T3 may be connected to an output line OL.

The fingerprint sensing unit 10 may include the first scan line SLn−1 transmitting a first scan signal to the first gate electrode G1 of the first thin film transistor T1, the second scan line SLn transmitting a second scan signal to the second gate electrode G2 of the second thin film transistor T2, the transmission line TL transmitting a driving voltage to the first source electrode S1 of the first thin film transistor T1 and the second source electrode S2 of the second thin film transistor T2, and the output line OL transmitting a driving current Id that flows through the third thin film transistor T3 to a sensing driver.

The reference capacitor Cr may include a first electrode CE1 connected to the second scan line SLn, and a second electrode CE2 connected to the first drain electrode D1 of the first thin film transistor T1, the third gate electrode G3 of the third thin film transistor T3, and a sensing electrode SE.

Driving of the fingerprint sensing unit 10 according to an exemplary embodiment of the present invention will be described in more detail below.

When the first scan signal is transmitted to the first scan line SLn−1 and the driving voltage is applied to the transmission line TL, the first thin film transistor T1 may be turned on. The first scan signal may be a pulse signal. For example, the first scan signal may correspond to a low voltage switching period of a signal held at a high voltage, or may correspond to a high voltage switching period of a signal held at a low voltage.

When the first thin film transistor T1 is turned on, the driving voltage of the transmission line TL may be transmitted to the third gate electrode G3 of the third thin film transistor T3 and the second electrode CE2 of the reference capacitor Cr through the first thin film transistor T1. Accordingly, the third gate electrode G3 of the third thin film transistor T3 and the second electrode CE2 of the reference capacitor Cr may receive the driving voltage. In addition, when the driving voltage is applied to the third gate electrode G3 of the third thin film transistor T3, the third thin film transistor T3 may be turned on.

When the second scan signal is transmitted to the second scan line SLn and the driving voltage is applied to the transmission line TL, the second thin film transistor T2 may be turned on. The second scan signal may be a pulse signal.

When the second thin film transistor T2 is turned on, and a gate voltage Vg is applied to the third gate electrode G3 of the third thin film transistor T3, the driving current Id may flow through the second thin film transistor T2 and the third thin film transistor T3. In an exemplary embodiment of the present invention, the gate voltage Vg may vary depending on a fingerprint capacitance Cf that is formed when a touch or a fingerprint contact is made. For example, the gate voltage Vg of the third gate electrode G3 may vary depending on capacitive coupling between the fingerprint capacitance Cf and the reference capacitance Cr. In addition, the driving current Id flowing through the second thin film transistor T2 and the third thin film transistor T3 may vary depending on the gate voltage Vg of the third gate electrode G3.

The output line OL may transmit the driving current Id to the sensing driver. The sensing driver may detect whether a touch input occurs, touch coordinates, ridges and valleys of fingerprints according to an amount of change in the driving current Id.

However, the structure of the fingerprint sensing unit according to an exemplary embodiment of the present invention is not limited thereto. The fingerprint sensing unit may include a plurality of thin film transistors, one or more capacitors, and wirings including one or more scan lines and one or more power lines.

Figure 4:
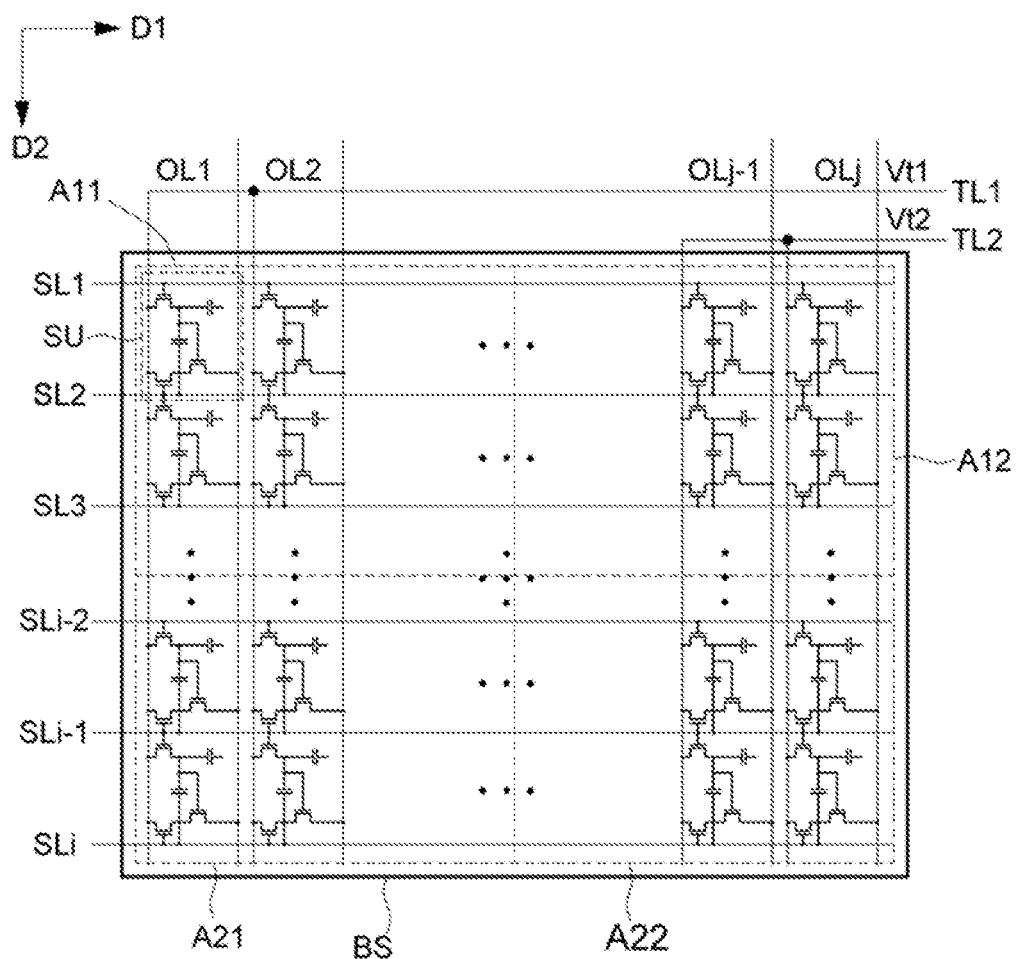
FIG. 4 is a configuration view of a touch sensing unit according to an exemplary embodiment of the present invention.

FIG. 4 is a configuration view of a touch sensing unit according to an exemplary embodiment of the present invention. FIG. 5 is a diagram of first and second common voltages applied to a touch sensing unit according to an exemplary embodiment of the present invention.

Figure 5:
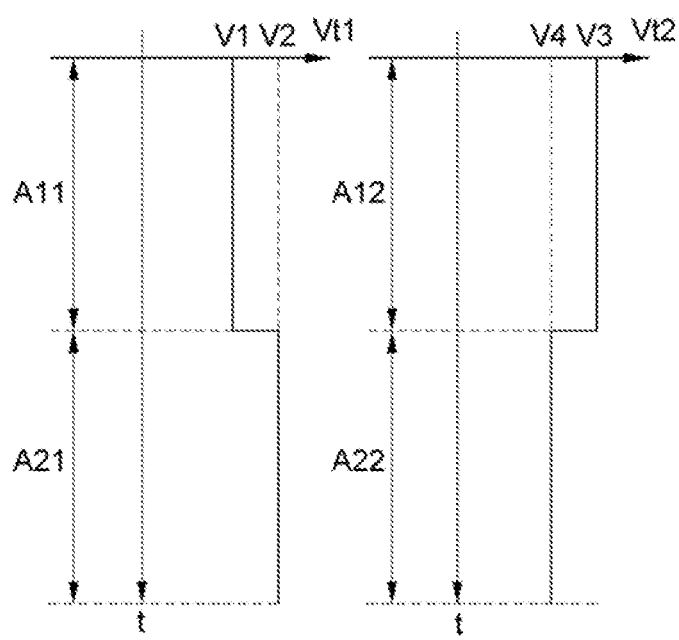
FIG. 5 is a diagram of first and second common voltages applied to a touch sensing unit according to an exemplary embodiment of the present invention.

According to an exemplary embodiment of the present invention, referring to FIGS. 4 and 5, the base substrate BS may include a plurality of areas. The base substrate BS may include a first area A11, a second area A12, a third area A21, and a fourth area A22. At least one sensing unit SU may be disposed in each area. As an example, a plurality of sensing units SU may be arranged in each area. For example, the sensing units SU in each area may be arranged in a matrix configuration including rows and columns extending along the first and second directions D1 and D2.

According to an exemplary embodiment of the present invention, the first area A11 and the second area A12 may be disposed adjacent to each other along the first direction D1, and the third area A21 and the fourth area A22 may be disposed adjacent to each other along the first direction D1. In addition, the first area A11 and the third area A21 may be disposed adjacent to each other along the second direction D2, and the second area A12 and the fourth area A22 may be disposed adjacent to each other along the second direction D2. In an exemplary embodiment of the present invention, each of the sensing units SU in the areas that are adjacent to each other along the second direction D2 may be connected to one transmission line. For example, the sensing units SU disposed in the first area A11 and the third area A21 that are adjacent to each other along the second direction D2 may be connected to the first transmission line TL1, and the sensing units SU disposed in the second area A12 and the fourth area A22 that are adjacent to each other along the second direction D2 may be connected to the second transmission line TL2. However, the size of each area and the number of sensing units SU included in each area are not limited, each area may have various sizes, and each area may include one sensing unit SU or may include a plurality of sensing units SU. In addition, each area may include different numbers of sensing units SU from each other.

The first transmission voltage Vt1 may be applied to the first transmission line TL1, and the second transmission voltage Vt2 may be applied to the second transmission line TL2. The first transmission voltage Vt1 may be a different voltage than the second transmission voltage Vt2.

According to an exemplary embodiment of the present invention, each of the first and second transmission voltages Vt1 and Vt2 may have a value that varies corresponding to the position in the second direction D2 of the sensing unit SU, to which each transmission voltage may be applied. For example, the first transmission voltage Vt1 may vary in value according to the position in the second direction D2 of the sensing unit SU connected to the first transmission line TL1, and the second transmission voltage Vt2 may vary in value according to the position in the second direction D2 of the sensing unit SU connected to the second transmission line TL2.

Each of the sensing units SU disposed in the first area A11 and the third area A21 connected to the first transmission line TL1 may be disposed at different positions from each other along the second direction D2. Respective scan signals may be sequentially applied to the first to i-th scan lines SL1 to SLi arranged along the second direction D2. For example, after the scan signal is applied to the sensing units SU disposed in the first area A11, the scan signal may be applied to the sensing units SU disposed in the third area A21. As the scan signal is applied to the sensing units SU, the first transmission voltage Vt1 may be applied to the sensing unit SU connected to the first transmission line TL1. Accordingly, when the scan signal is applied to the sensing units SU disposed in the first area A11, the first transmission voltage Vt1 of a first voltage V1 may be applied to the first transmission line TL1, and when the scan signal is applied to the sensing units SU disposed in the third area A21, the first transmission voltage Vt1 of a second voltage V2 may be applied to the first transmission line TL1. In addition, when the scan signal is applied to the sensing units SU disposed in the second area A12, the second transmission voltage Vt2 of a third voltage V3 may be applied to the second transmission line TL2, and when the scan signal is applied to the sensing units SU disposed in the fourth area A22, the second transmission voltage Vt2 of a fourth voltage V4 may be applied to the second transmission line TL2. In an exemplary embodiment of the present invention, the first voltage V1, the second voltage V2, the third voltage V3, and the fourth voltage V4 may have different values from each other. However, exemplary embodiments of the present invention are not limited thereto, and the first voltage V1 and the second voltage V2 may be substantially equal to each other, and the third voltage V3 and the fourth voltage V4 may be substantially equal to each other.

The operation characteristics of the thin film transistors T1, T2 and T3, such as the kickback voltage or the initial driving voltage, may change in accordance with the operation time of the thin film transistors T1, T2 and T3, the temperature of the thin film transistors T1, T2 and T3, and the light applied to the thin film transistors T1, T2, and T3. For example, as the operation time of the thin film transistors T1, T2 and T3 included in each sensing unit SU, the temperature of the thin film transistors T1, T2 and T3, and the light applied to the thin film transistors T1, T2, and T3 may be different from each other depending on the position in which the sensing units SU are disposed, the operation characteristics of the thin film transistors T1, T2, and T3 included in each sensing unit SU may vary depending on the position in which the sensing units SU are disposed. According to an exemplary embodiment of the present invention, the transmission voltages having different magnitudes may be applied to the sensing units SU depending on the position where the sensing units SU are disposed, thus compensating for the changed or variable operation characteristics.

Figure 6:
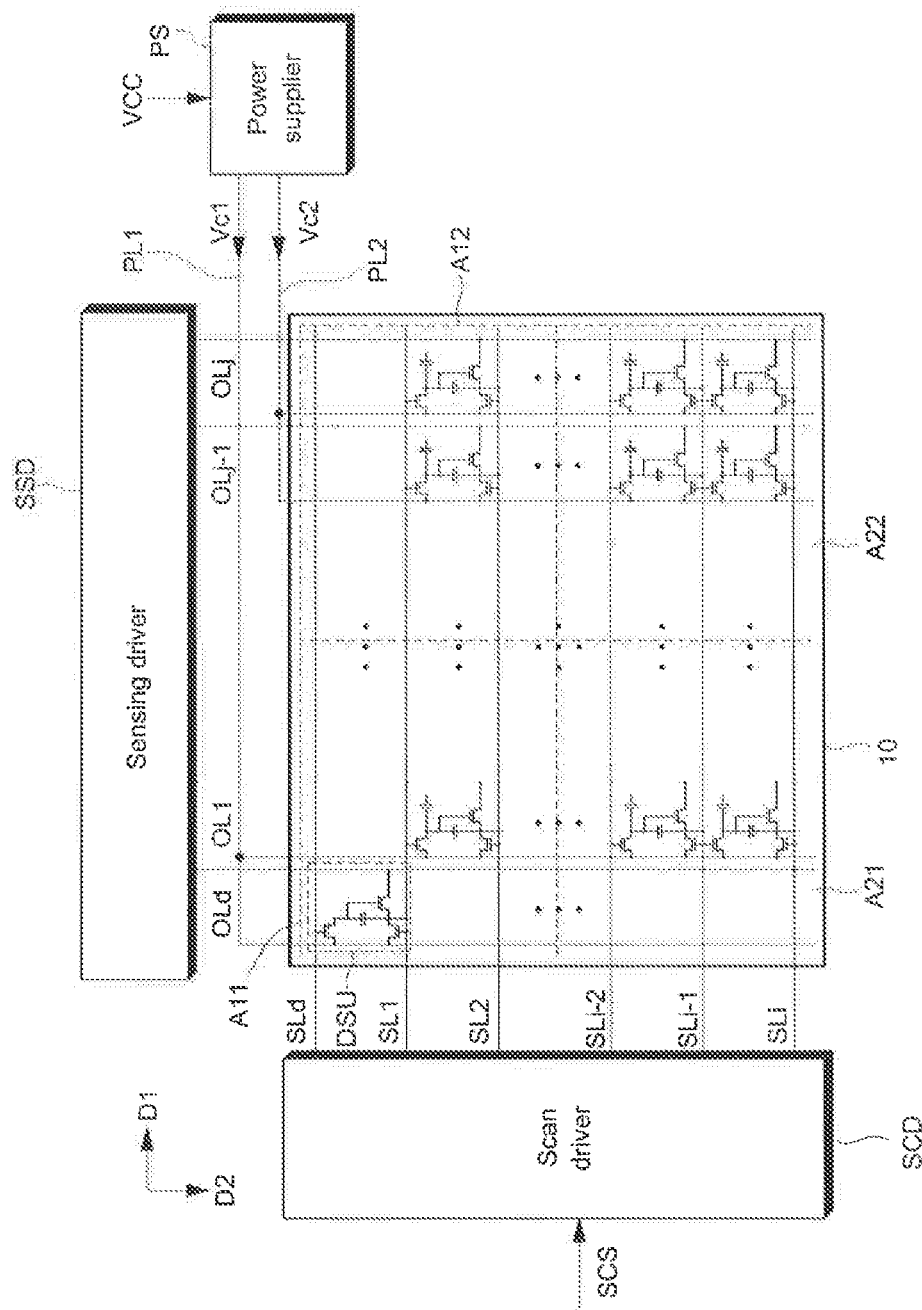
FIG. 6 is a block diagram of a touch sensing unit according to an exemplary embodiment of the present invention.
Figure 7:
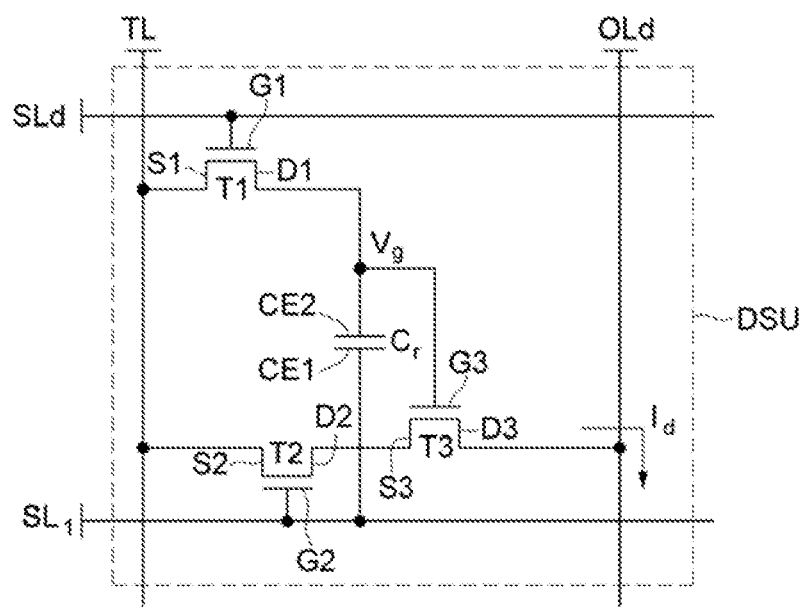
FIG. 7 is a configuration view of a dummy sensing unit of FIG. 6.
Figure 8:
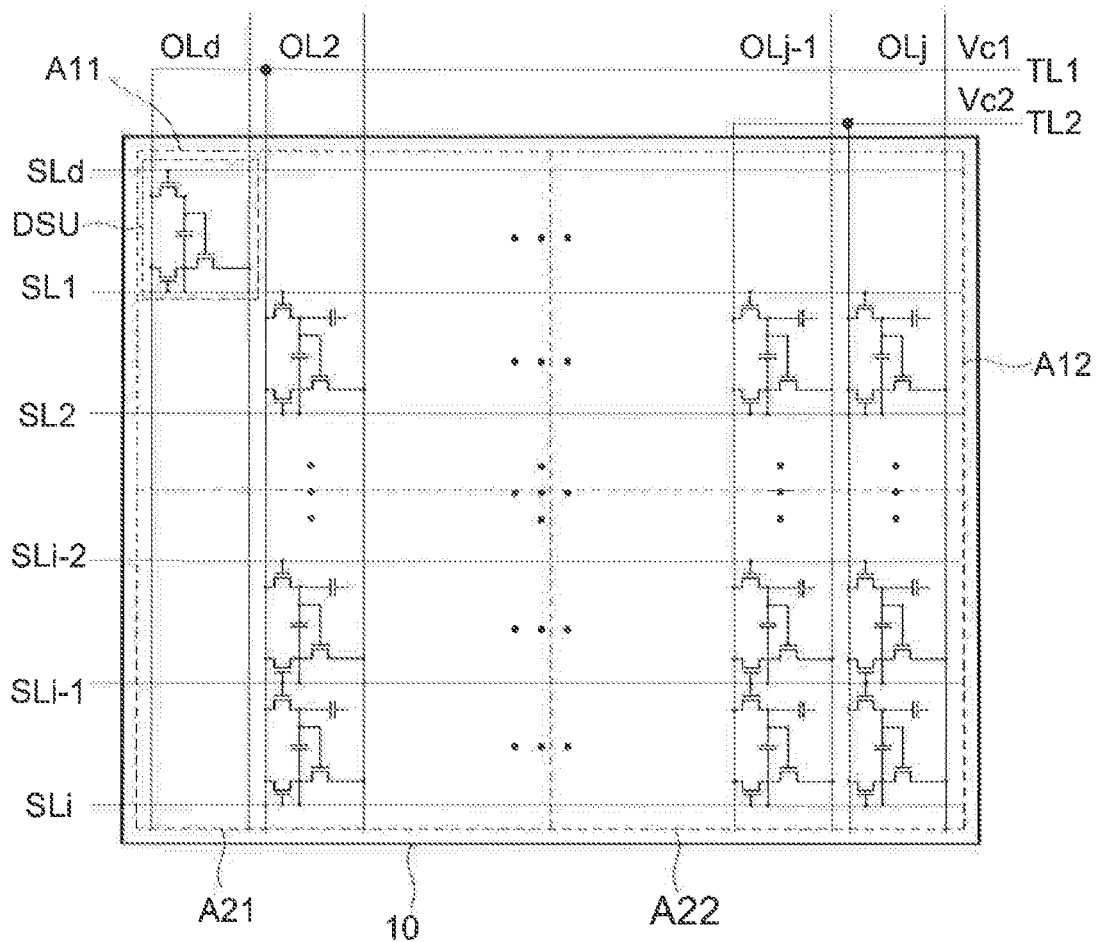
FIG. 8 is a configuration view of a touch sensing unit according to an exemplary embodiment of the present invention.

FIG. 6 is a block diagram of a touch sensing unit according to an exemplary embodiment of the present invention. FIG. 7 is a configuration view of a dummy sensing unit of FIG. 6. FIG. 8 is a configuration view of a touch sensing unit according to an exemplary embodiment of the present invention.

According to an exemplary embodiment of the present invention, referring to FIGS. 6 to 8, a touch sensing unit may include a dummy scan line SLd and a dummy output line OLd.

The dummy scan line SLd may extend along the first direction D1, similar to the first to i-th scan lines SL1 to SLi. Thus, dummy sensing units may similarly extend in the first direction D1 and/or the second direction D2. The dummy scan line SLd may be disposed adjacent to the first scan line SL1. However, the position of the dummy scan line SLd is not limited thereto, and the dummy scan line SLd may be located at a central portion with respect to the first direction D1 in each area A11, A12, A21, and A22.

The dummy output line OLd may extend along the second direction D2, similar to the first to j-th output lines OL1 through OLj. The dummy output line OLd may be disposed adjacent to the first output line OL1. However, the position of the dummy output line OLd is not limited thereto, and the dummy output line OLd may be located at a central portion with respect to the second direction D2 in each area.

According to an exemplary embodiment of the present invention, a dummy sensing unit DSU may be connected to the dummy scan line SLd and the dummy output line OLd.

The dummy sensing unit DSU might not include the sensing electrode SE, and the fingerprint capacitance Cf may not be formed in the dummy sensing unit DSU (e.g., the fingerprint capacitance Cf might not be formed by a touch). Accordingly, the dummy sensing unit DSU may detect the driving current that varies depending on the operation time of thin film transistors T1, T2, and T3 included in the dummy sensing unit DSU, the temperature of the thin film transistors T1, T2 and T3, and the light applied to the thin film transistors T1, T2 and T3. For example, the driving current Id of the dummy sensing unit DSU may be detected according to each condition (e.g., operation time, temperature and light exposure). For example, the driving current flowing through the dummy sensing unit DSU according to each condition may be analyzed, and the first conditional transmission voltage Vc1 and the second conditional transmission voltage Vc2 respectively applied to the first and second transmission lines TL1 and TL2 may be determined.

Figure 9:
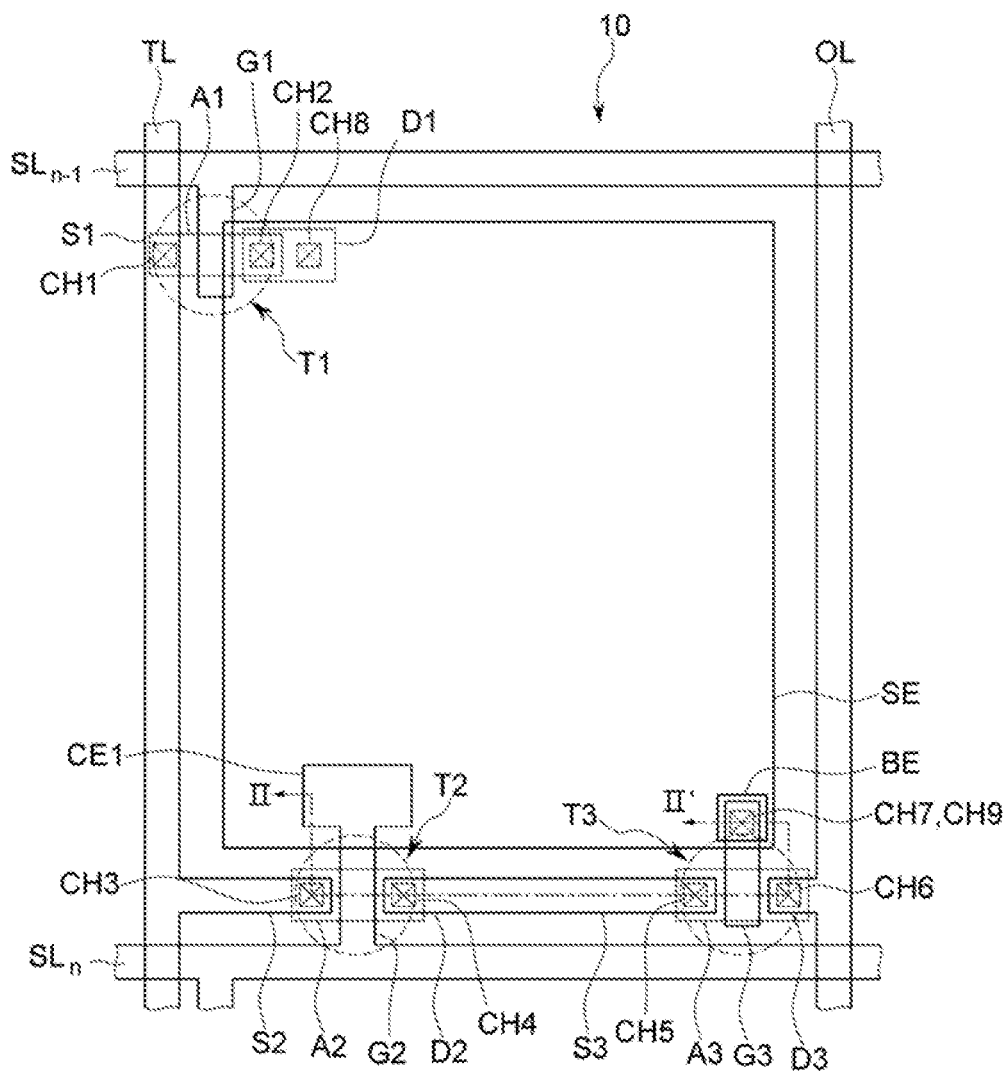
FIG. 9 is a plan view of a sensing unit according to an exemplary embodiment of the present invention.
Figure 10:
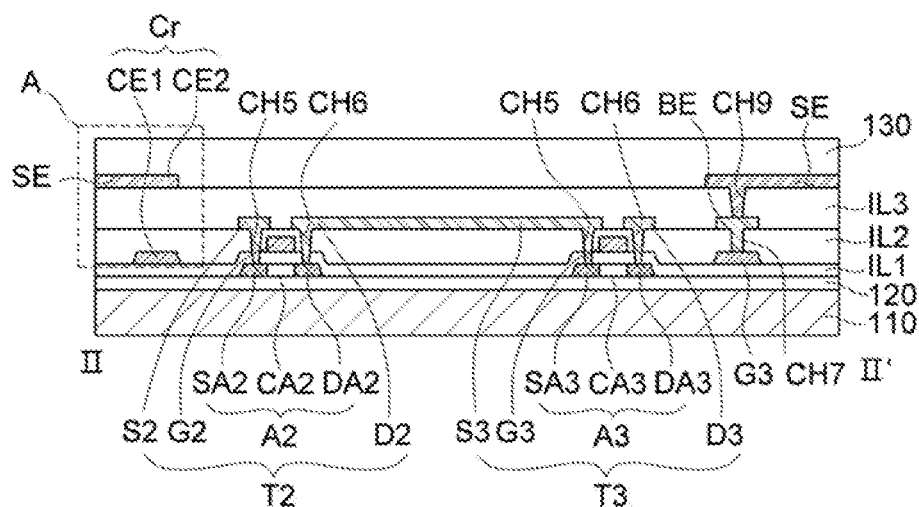
FIG. 10 is a cross-sectional view taken along line II-IP of FIG. 9.

FIG. 9 is a plan view of a sensing unit according to an exemplary embodiment of the present invention. FIG. 10 is a cross-sectional view taken along line II-II' of FIG. 9.

Referring to FIGS. 9 and 10, the fingerprint sensing unit 10 according to an exemplary embodiment of the present invention may include a substrate 110; and first, second, and third thin film transistors T1, T2, and T3, first and second scan lines SLn−1 and SLn, a transmission line TL, an output line OL, a sensing electrode SE, a buffer layer 120, first, second, and third insulating layers IL1, IL2, and IL3, and a protective layer 130 disposed on the substrate 110. In an exemplary embodiment of the present invention, the first, second, and third thin film transistors T1, T2, and T3 include first, second, and third gate electrodes G1, G2 and G3, first, second, and third source electrodes S1, S2 and S3, first, second, and third drain electrodes D1, D2, and D3, and first, second, and third active layers A1, A2, and A3, respectively.

The substrate 110 may be a plastic film having flexible characteristics. For example, the substrate 110 may include polyimide. For example, the display device including the substrate 110 may be a bendable or foldable display device that is in a curved or bent state at some times and is in a substantially flat state at other times. Alternatively, the display device may be in a permanently folded, curved or bent state. However, exemplary embodiments of the present invention are not limited thereto, and the substrate 110 may include an insulating material such as glass or quartz. The substrate 110 may include a material selected from materials having relatively high mechanical strength, thermal stability, transparency, surface smoothness, ease of handling, and water resistance.

The buffer layer 120 may be disposed on the substrate 110. The buffer layer 120 may substantially prevent penetration of impurities and may planarize an upper surface of the substrate 110. For example, the buffer layer 120 may include one of silicon nitride ($SiN_x$), silicon oxide ($SiO_2$), or silicon oxynitride ($SiO_xN_y$).

The first active layer A1, the second active layer A2, and the third active layer A3 may be disposed on the buffer layer 120. The first, second, and third active layers A1, A2, and A3 may each include a semiconductor material. The first active layer A1 may include a first source area, a first drain area, and a first channel area between the first source area and the first drain area. The second active layer A2 may include a second source area SA2, a second drain area DA2, and a second channel area CA2 between the second source area SA2 and the second drain area DA2. The third active layer A3 may include a third source area SA3, a third drain area DA3, and a third channel area CA3 between the third source area SA3 and the third drain area DA3.

The first, second, and third active layers A1, A2, and A3 may include amorphous silicon, polycrystalline silicon, or an oxide semiconductor. The oxide semiconductor may include at least one of oxides based on titanium (Tl), hafnium (Hf), zirconium (Zr), aluminum (Al), tantalum (Ta), germanium (Ge), zinc (Zn), gallium (Ga), tin (Sn), or indium (In), or composite oxides thereof such as zinc oxide (ZnO), indium-gallium-zinc oxide ($InGaZnO_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge-Ga—O), titanium-indium-zinc oxide (Tl—In—Zn—O), or hafnium-indium-zinc oxide (Hf—In—Zn—O). In the case where the first, second, and third active layers A1, A2, and A3 include an oxide semiconductor, a separate protective layer may be additionally provided to protect the oxide semiconductor from an external environment such as a high temperature.

The first, second (SA2), and third (SA3) source areas may be spaced apart from the first, second (DA2), and third (DA3) drain areas with the first, second (CA2), and third (CA3) channel areas therebetween, respectively. For example, the first, second (SA2, and third (SA3) source areas and the first, second (DA2), and third (DA3) drain areas may be formed by doping a semiconductor material with an n-type impurity or a p-type impurity.

The first insulating layer IL1 may be disposed on the first, second, and third active layers A1, A2, and A3. The first insulating layer IL1 may be a gate insulating layer. The first insulating layer IL1 may include one of silicon nitride ($SiN_x$), silicon oxide ($SiO_2$), or silicon oxynitride ($SiO_xN_y$).

The first gate electrode G1, the second gate electrode G2, and the third gate electrode G3 may be disposed on the first insulating layer IL1. The first, second, and third gate electrodes G1, G2 and G3 may be disposed overlapping the first, second, and third active layers A1, A2 and A3, respectively. For example, the first, second, and third gate electrodes G1, G2 and G3 may be disposed overlapping the first, second, and third channel areas CA1, CA2 and CA3 of the first, second, and third active layers A1, A2 and A3, respectively.

The first scan line SLn−1, the second scan line SLn, and the first electrode CE1 of the reference capacitor Cr may be disposed on the first insulating layer IL1. The first electrode CE1 of the reference capacitor Cr may be formed by a same process as the second gate electrode G2. For example, the first electrode CE1 may include a same material as the second gate electrode G2. As an example, the first electrode CE2 and the second gate electrode G2 may be formed as a single integrally formed structure.

The second insulating layer IL2 may be disposed on the first, second, and third gate electrodes G1, G2 and G3, the first and second scan lines SLn−1 and SLn, and the first electrode CE1 of the reference capacitor Cr. The second insulating layer IL2 may be an organic insulating layer or an inorganic insulating layer, and may include silicon nitride ($SiN_k$), silicon oxide ($SiO_2$), or silicon oxynitride ($SiO_xN_y$).

The first, second, and third source electrodes S1, S2 and S3 and the first, second, and third drain electrodes D1, D2 and D3 may be disposed on the second insulating layer IL2. The first source electrode S1 may be in direct contact with the first source area SA1 of the first active layer A1 through a first contact hole CH1 defined in the first insulating layer IL1 and the second insulating layer IL2. The first drain electrode D1 may be in direct contact with the first drain area DA1 of the first active layer A1 through a second contact hole CH2 defined in the first insulating layer IL1 and the second insulating layer IL2. The second source electrode S2 may be in direct contact with the second source area SA2 of the second active layer A2 through a third contact hole CH3 defined in the first insulating layer IL1 and the second insulating layer IL2. The second drain electrode D2 may be in direct contact with the second drain area DA2 of the second active layer A2 through a fourth contact hole CH4 defined in the first insulating layer IL1 and the second insulating layer IL2. The third source electrode S3 may be in direct contact with the third source area SA3 of the third active layer A3 through a fifth contact hole CH5 defined in the first insulating layer IL1 and the second insulating layer IL2. The third drain electrode D3 may be in direct contact with the third drain area DA3 of the third active layer A3 through a sixth contact hole CH6 defined in the first insulating layer IL1 and the second insulating layer IL2.

The transmission line TL, the output line OL, and a bridge electrode BE are disposed on the second insulating layer IL2. The bridge electrode BE may be in direct contact with the third gate electrode G3 through a seventh contact hole CH7 defined in the second insulating layer IL2.

The third insulating layer IL3 may be disposed on the first, second, and third source electrodes S1, S2 and S3, the first, second, and third drain electrodes D1, D2 and D3, the transmission line TL, the output line OL, and the bridge electrode BE. The third insulating layer IL3 may protect the first, second, and third thin film transistors T1, T2, and T3 and may planarize an upper surface thereof.

The third insulating layer IL3 may be an organic insulating layer or an inorganic insulating layer, and may include silicon nitride ($SiN_x$), silicon oxide ($SiO_2$), or silicon oxynitride ($SiO_xN_y$). For example, the third insulating layer IL3 may include a photosensitive polymer resin.

The first, second, and third insulating layers IL1, IL2, and IL3 may define an opening. At least a portion of the buffer layer 120 may be exposed through the first, second, and third insulating layers IL1, IL2, and IL3 through the opening. The opening may an area above the buffer layer 120 that does not overlap the first, second, and third insulating layers IL1, IL2, and IL3. In addition, a boundary of the opening at which the first insulating layer IL1 contacts the buffer layer 120 may be defined as an edge of the opening.

The edge of the opening may form a closed loop (e.g., in a plan view), and the closed loop may have a quadrangular shape. However, exemplary embodiments of the present invention are not limited thereto, and the closed loop may have various shapes such as circular, polygonal, or irregular shapes.

The sensing electrode SE may be disposed on the third insulating layer IL3. The sensing electrode SE may be in direct contact with the first drain electrode D1 of the first thin film transistor T1 through an eighth contact hole CH8 defined in the third insulating layer IL3, and may be in direct contact with the bridge electrode BE connected to the third gate electrode G3 of the third thin film transistor T3 through a ninth contact hole CH9 defined in the third insulating layer IL3.

At least a portion of the sensing electrode SE according to an exemplary embodiment of the present invention may be disposed in the opening defined by the first, second, and third insulating layers IL1, IL2, and IL3. For example, at least a portion of the sensing electrode SE may be in direct contact with the buffer layer 120 that is exposed through the first, second, and third insulating layers IL1, IL2, and IL3. Since only the buffer layer 120 is disposed between the substrate 110 and the sensing electrode SE in the opening formed in the first, second, and third insulating layers IL1, IL2, and IL3, without the first, second, and third insulating layers IL1, IL2 and IL3 disposed therebetween, the reflection of external light may be reduced in the fingerprint sensing unit 10, which will be described in more detail below.

The second electrode CE2 of the reference capacitor Cr may be disposed on the third insulating layer IL3. The second electrode CE2 of the reference capacitor Cr may be formed by a same process as the sensing electrode SE. The second electrode CE2 may include a same material as the sensing electrode SE. As an example, the sensing electrode SE and the second electrode CE2 may be a single integrally formed structure.

The sensing electrode SE and the second electrode CE2 of the reference capacitor Cr may each include metal or a transparent conductive oxide (TCO). For example, the sensing electrode SE and the another electrode CE2 of the reference capacitor Cr may include an aluminum-based metal such as aluminum (Al) or an aluminum alloy, a silver-based metal such as silver (Ag) or a silver alloy, a copper-based metal such as copper (Cu) or a copper alloy, or a molybdenum-based metal such as molybdenum (Mo) or a molybdenum alloy. The sensing electrode SE and the second electrode CE2 of the reference capacitor Cr may include transparent conductive oxide (TCO), for example, one of indium tin oxide (ITO), indium zinc oxide (IZO), zinc oxide (ZnO), carbon nanotube (CNT), or graphene. The sensing electrode SE and the second electrode CE2 of the reference capacitor Cr may each have a multilayer structure.

The protective layer 130 may be disposed on the sensing electrode SE and the second electrode CE2 of the reference capacitor Cr. The protective layer 130 may include at least one of an organic insulating layer or an inorganic insulating layer. The protective layer 130 may protect the sensing electrode SE and the second electrode CE2 of the reference capacitor Cr and may flatten an upper surface thereof.

Figure 11:
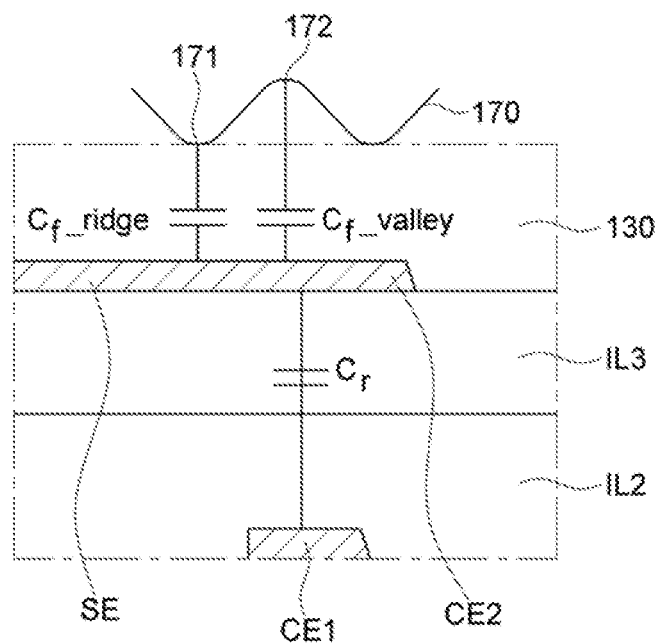
FIG. 11 is a cross-sectional view of portion 'A' in FIG. 10.

FIG. 11 is a cross-sectional view of portion 'A' in FIG. 10.

Referring to FIG. 11, a fingerprint 170 may include a ridge 171 and a valley 172, thus causing a difference in distance from the sensing electrode SE. For example, a distance between the ridge 171 and the sensing electrode SE may be less than a distance between the valley 172 and the sensing electrode SE. Such a distance difference may cause a difference between a fingerprint capacitance Cf ridge between the ridge 171 and the sensing electrode SE and a fingerprint capacitance Cf valley between the valley 172 and the sensing electrode SE.

As described above, the gate voltage Vg of the third gate electrode G3 based on capacitive coupling between the fingerprint capacitance Cf and the reference capacitance Cr may vary depending on the difference of the fingerprint capacitance Cf. In addition, the driving current Id flowing through the second thin film transistor T2 and the third thin film transistor T3 may vary depending on the gate voltage Vg of the third gate electrode G3. The sensing driver may detect whether a touch input occurs, touch coordinates, ridges and valleys of fingerprints according to an amount of change in the driving current Id.

Figure 12:
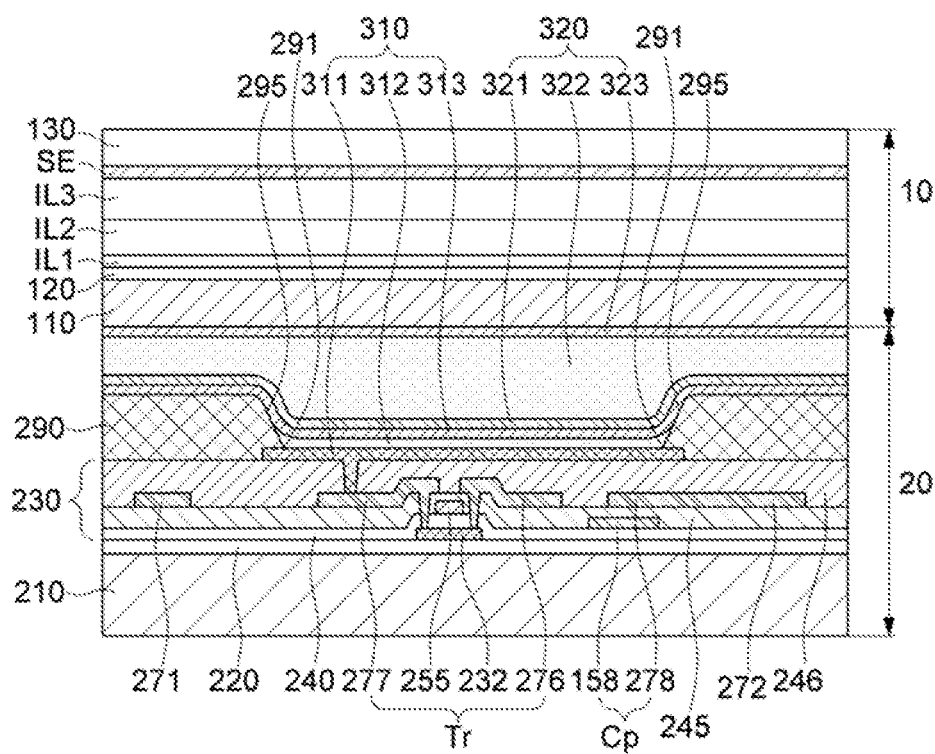
FIG. 12 is a cross-sectional view of a display device including a sensing unit according to an exemplary embodiment of the present invention.

FIG. 12 is a cross-sectional view of a display device including a sensing unit according to an exemplary embodiment of the present invention.

Referring to FIG. 12, the display unit 20 may include a base substrate 210, a driving circuit 230, a pixel defining layer 290, an OLED 310, and a thin film encapsulation layer 320.

The buffer layer 220 may be disposed on the base substrate 210. The buffer layer 220 may substantially prevent penetration of impurities and may planarize a top surface of the base substrate 210. For example, the buffer layer 220 may include one of silicon nitride ($SiN_x$), silicon oxide ($SiO_2$), or silicon oxynitride ($SiO_xN_y$). However, the buffer layer 220 may be omitted.

The driving circuit unit 230 may be disposed on the buffer layer 220. The driving circuit unit 230 may be in a position corresponding to a portion including a plurality of thin film transistors Tr and capacitors Cp, and may drive the OLED 310. The driving circuit unit 230 may include a gate line and a data line 271 and a common power line 272 insulated from and intersecting the gate line. The OLED 310 may emit light according to a driving signal received from the driving circuit unit 230 to display images.

The display device according to an exemplary embodiment of the present invention may have a 2Tr-1Cap structure in which two thin film transistors Tr and one capacitor Cp are provided in a pixel PX, or may have various structures including three or more thin film transistors Tr and two or more capacitors Cp in a pixel PX.

The capacitor Cp may include a pair of electrodes 158 and 278 with an insulating interlayer 245 disposed therebetween. In an exemplary embodiment of the present invention, the insulating interlayer 245 may be a dielectric element. A capacitance of the capacitor Cp may be determined by electric charges accumulated in the capacitor Cp and a voltage between the two electrodes 158 and 278.

The thin film transistor Tr may include a semiconductor layer 232, a gate electrode 255, a source electrode 276 and a drain electrode 277. The semiconductor layer 232 may be insulated from the gate electrode 255 by a gate insulating layer 240. The thin film transistor Tr may apply, to a first electrode 311, a driving power for an organic light emitting layer 312 of the OLED 310 in a pixel PX to emit light. In an exemplary embodiment of the present invention, the gate electrode 255 may be connected to an electrode 158 of the capacitor Cp, each of the source electrode 276 and the electrode 278 of the capacitor Cp may be connected to the common power line 272, and the drain electrode 277 may be connected to the first electrode 311 of the OLED 310 through a contact hole defined in a planarization layer 246.

The planarization layer 246 may be disposed on the insulating interlayer 245. The planarization layer 246 may include an insulating material and may protect the driving circuit unit 230. The planarization layer 246 and the insulating interlayer 245 may include a same material as each other.

The first electrode 311 may be disposed on the planarization layer 246. The first electrode 311 may be a pixel electrode and may be an anode. The first electrode 311 may be electrically conductive and may be one of a transmissive electrode, a transflective electrode or a reflective electrode.

When the first electrode 311 is a transmissive electrode, the first electrode 311 may include transparent conductive oxide (TCO). For example, at least one of indium tin oxide (ITO), indium zinc oxide (IZO), zinc oxide (ZnO) or indium tin zinc oxide (ITZO) may be included in the TCO. When the first electrode 311 is a transflective electrode or a reflective electrode, the first electrode 311 may include at least one of Ag, Mg, Al, Pt, Pd, Au, Ni, Nd, Ir, Cr, or Cu.

The pixel defining layer 290 may be disposed on the planarization layer 246, and the pixel defining layer 290 may divide a light emission area. In an exemplary embodiment of the present invention, the light emission area may be referred to as a pixel area. The pixel defining layer 290 may include a polymer organic material. For example, the pixel defining layer 290 may include at least one of a polyimide (PI)-based resin, a polyacrylic resin, a PET resin, or a PEN resin.

The pixel defining layer 290 may define a pixel opening 295 and at least a portion of the first electrode 311 may be exposed from the pixel defining layer 290 through the pixel opening 295. The first electrode 311 may overlap at least a portion of the pixel defining layer 290 and might not overlap the pixel defining layer 290 in the pixel opening 295. The pixel opening 295 may be defined as an area above the first electrode 311 that does not overlap the pixel defining layer 290, and may be defined as a light emission area. A boundary of the pixel opening 295 at which the pixel defining layer 290 is in direct contact with the first electrode 311 may be defined as an edge 291 of the pixel opening 295.

The organic light emitting layer 312 may be disposed on the first electrode 311. For example, the organic light emitting layer 312 may be disposed in the pixel opening 295 on the first electrode 311. The organic light emitting layer 312 may be disposed on a sidewall of the pixel defining layer 290 which defines the pixel opening 295 and on the pixel defining layer 290.

The organic light emitting layer 312 may include a light emitting material. In addition, the organic light emitting layer 312 may include a host and a light emitting dopant. As an example, the organic light emitting layer 312 may be formed through various methods such as a vacuum deposition method, a spin coating method, a cast method, a Langmuir-blodgett (LB) method, an inkjet printing method, a laser printing method, or a laser induced thermal imaging (LITI) method.

A second electrode 313 may be disposed on the organic light emitting layer 312. The second electrode 313 may be a common electrode and may be a cathode. The second electrode 313 may be a transmissive electrode, a transflective electrode, or a reflective electrode.

When the second electrode 313 is a transmissive electrode, the second electrode 313 may include at least one of Li, Ca, LiF/Ca, LiF/Al, Al, Mg, BaF, Ba, Ag, or Cu. For example, the second electrode 313 may include a mixture of Ag and Mg. When the second electrode 313 is a transflective electrode or a reflective electrode, the second electrode 313 may include at least one of Ag, Mg, Al, Pt, Pd, Au, Ni, Nd, Ir, Cr, Li, Ca, LiF/Ca, LiF/Al, Mo, T1 or Cu. The second electrode 313 may further include a transparent conductive layer which includes, for example, indium tin oxide (ITO), indium zinc oxide (IZO), zinc oxide (ZnO), or indium-zinc-tin oxide (IZTO), in addition to the transflective electrode or the reflective electrode.

At least one of a hole injection layer (HIL) or a hole transport layer (HTL) may be disposed between the first electrode 311 and the organic light emitting layer 312, and at least one of an electron transport layer (ETL) and an electron injection layer (EIL) may be disposed between the organic light emitting layer 312 and the second electrode 313.

When the OLED 310 is a top emission type OLED, the first electrode 311 may be a reflective electrode and the second electrode 313 may be a transmissive electrode or a transflective electrode. When the OLED 310 is a bottom emission type OLED, the first electrode 311 may be a transmissive electrode or a transflective electrode, and the second electrode 313 may be a reflective electrode. According to an exemplary embodiment of the present invention, the OLED 310 may be a top emission type OLED, the first electrode 311 may be a reflective electrode, and the second electrode 313 may be a transflective electrode.

The thin film encapsulation layer 320 may be disposed on the second electrode 313 and may protect the OLED 310. The thin film encapsulation layer 320 may substantially prevent outside air, moisture or oxygen from penetrating into the OLED 310.

The thin film encapsulation layer 320 may include at least one inorganic layer 321 and 323 and at least one organic layer 322 which is arranged alternately with the at least one inorganic layer 321 and 323. Referring to FIG. 12, the thin film encapsulation layer 320 may include two inorganic layers 321 and 323 and one organic layer 322, but exemplary embodiments of the present invention are not limited thereto.

The inorganic layers 321 and 323 may include one or more inorganic materials, such as, $Al_2O_3$, $TiO_2$, $ZrO$, $SiO_2$, AlON, AlN, SiON, $Si_3N_4$, ZnO, or $Ta_2O_5$. The inorganic layers 321 and 323 may be formed through methods such as a chemical vapor deposition (CVD) method or an atomic layer deposition (ALD) method. However, exemplary embodiments of the present invention are not limited thereto.

The organic layer 322 may include a polymer-based material. Examples of the polymer-based material may include, for example, an acrylic resin, an epoxy resin, polyimide or polyethylene. The organic layer 322 may be formed through a thermal deposition process. The thermal deposition process for forming the organic layer 322 may be performed in a range of temperature that might not damage the OLED 310. However, exemplary embodiments of the present invention are not limited thereto.

The inorganic layers 321 and 323 which may have a relatively high density of thin film may substantially prevent or reduce permeation of, for example, moisture or oxygen.

Thus, a permeation of moisture and oxygen into the OLED 310 may be substantially prevented by the inorganic layers 321 and 323.

Moisture and oxygen that have passed through the inorganic layers 321 and 323 may further be blocked by the organic layer 322. The organic layer 322 may have relatively low permeation prevention efficiency as compared to the inorganic layers 321 and 323. However, the organic layer 322 may also serve as a buffer layer to reduce stress between one of the inorganic layers 321 and 323 and another of the inorganic layers 321 and 323, in addition to the moisture permeation preventing function. Further, since the organic layer 322 has planarizing characteristics, an uppermost surface of the thin film encapsulation layer 320 may be planarized by the organic layer 322.

The fingerprint sensing unit 10 may be disposed on the display unit 20 including the base substrate 210, the driving circuit unit 230, the pixel defining layer 290, the OLED 310 and the thin film encapsulation layer 320. An adhesive member may be disposed between the fingerprint sensing unit 10 and the display unit 20.

The fingerprint sensing unit 10 according to an exemplary embodiment of the present invention may include the opening described above defined by the first, second, and third insulation layers IL1, IL2, and IL3. The opening of the fingerprint sensing unit 10 may overlap the pixel opening 295 of the display unit 20. In addition, a sensing electrode SE disposed in the opening may correspond to one OLED 310. For example, a sensing electrode SE may be disposed overlapping a first electrode 311. However, exemplary embodiments of the present invention are not limited thereto, and a sensing electrode SE may correspond to a plurality of OLEDs 310.

The touch sensing unit and the display device including the touch sensing unit according to an exemplary embodiment of the present invention may increase the reliability and accuracy of touch driving in the touch sensing unit and the display device including the touch sensing unit, by compensating for the characteristics of the elements (e.g., according to an accuracy of touch or fingerprint detection, or according to variation occurring as a result of driving time, light, or temperature) according to their position on the display substrate.

While the present invention has been illustrated and described with reference to the embodiments thereof, it will be apparent to those of ordinary skill in the art that various changes in form and detail may be formed thereto without departing from the spirit and scope of the present invention.

What is claimed is:

1. A touch sensing unit comprising:
a base substrate;
a plurality of sensing units disposed on the base substrate;
a plurality of scan lines extending along a first direction and arranged along a second direction that intersects the first direction;
a plurality of output lines extending along the second direction and arranged along the first direction;
a first transmission line and a second transmission line connected to the plurality of sensing units; and
a dual-output power supply having a first output connected to the first transmission line and a second output connected to the second transmission line, wherein:
the first transmission line is configured to receive a first non-zero transmission voltage and the second transmission line is configured to simultaneously receive a second non-zero transmission voltage different from the first non-zero transmission voltage,
each of the first transmission voltage and the second transmission voltage has a different value depending on a position of a sensing unit of the plurality of sensing units, and
at least one of the plurality of scan lines is connected to at least a first one of the plurality of sensing units connected to the first transmission line and to at least a second one of the plurality of sensing units connected to the second transmission line, said first and second sensing units being configured to be read simultaneously.

2. The touch sensing unit of claim 1, wherein the base substrate comprises a first area and a second area adjacent to the first area along the first direction, and
at least one of the plurality of sensing units is disposed in each of the first area, and the second area.

3. The touch sensing unit of claim 2, wherein the base substrate comprises a third area adjacent to the first area along the second direction, and
at least one of the plurality of sensing units is disposed in the third area.

4. The touch sensing unit of claim 3, wherein the sensing unit disposed in the first area and the sensing unit disposed in the third area are connected to the first transmission line and receive the first transmission voltage.

5. The touch sensing unit of claim 4, wherein the first transmission voltage applied to the sensing unit disposed in the first area has a value different from a value of the second transmission voltage applied to the sensing unit disposed in the second area.

6. The touch sensing unit of claim 4, wherein the plurality of scan lines receive a scan signal sequentially along the second direction, and
the first transmission voltage that is applied to the sensing unit disposed in the first area when the scan signal is applied to the sensing unit disposed in the first area has a value different from a value of the first transmission voltage that is applied to the sensing unit disposed in the second area when the scan signal is applied to the sensing unit disposed in the third area.

7. The touch sensing unit of claim 2, wherein the sensing unit disposed in the first area is connected to the first transmission line and receives the first transmission voltage, and
the sensing unit disposed in the second area is connected to the second transmission line and receives the second transmission voltage.

8. The touch sensing unit of claim 1, further comprising:
a dummy scan line disposed adjacent to the second plurality of scan lines and extending along the first direction;
a dummy output line disposed adjacent to the third plurality of output lines and extending along the second direction; and
a dummy sensing unit connected to the dummy scan line and the dummy output line.

9. The touch sensing unit of claim 8, wherein the dummy sensing unit detects a driving current that varies depending on driving time, light or temperature.

10. The touch sensing unit of claim 1, wherein each of the plurality of sensing units comprises a thin film transistor.

11. A display device comprising:
a display unit; and
a touch sensing unit disposed on the display unit,
wherein the touch sensing unit comprises:
a base substrate;
a plurality of sensing units disposed on the base substrate;

a plurality of scan lines extending along a first direction and arranged along a second direction that intersects the first direction;

a plurality of output lines extending along the second direction and arranged along the first direction;

a first transmission line and a second transmission line connected to the plurality of sensing units; and a dual-output power supply having a first output connected to the first transmission line and a second output connected to the second transmission line, wherein the first transmission line is configured to receive a first non-zero transmission voltage and the second transmission line is configured to simultaneously receive a second non-zero transmission voltage different from the first non-zero transmission voltage.

12. The display device of claim 11, wherein:

the dual-output power supply is a variable dual-output power supply having a first variable output connected to the first transmission line and a second variable output connected to the second transmission line, each of the first transmission voltage and the second transmission voltage has a different value depending on a position of the sensing units of the plurality of sensing units, and at least one of the plurality of scan lines is connected to at least a first one of the plurality of sensing units connected to the first transmission line and to at least a second one of the plurality of sensing units connected to the second transmission line, said first and second sensing units being configured to be read simultaneously.

13. The display device of claim 12, wherein the base substrate comprises a first area and a second area adjacent to the first area along the first direction, and at least one of the plurality of sensing units is disposed in each of the first area, and the second area.

14. The display device of claim 13, wherein the sensing unit disposed in the first area is connected to the first transmission line and receives the first transmission voltage, and the sensing unit disposed in the second area is connected to the second transmission line and receives the second transmission voltage.

15. The display device of claim 14, wherein the first transmission voltage applied to the sensing unit disposed in the first area has a value different from a value of the second transmission voltage applied to the sensing unit disposed in the second area.

16. The display device of claim 11, further comprising:

a dummy scan line disposed adjacent to the plurality of scan lines and extending along the first direction; and a dummy output line disposed adjacent to the plurality of output lines and extending along the second direction.

17. The display device of claim 16, further comprising a dummy sensing unit connected to the dummy scan line and the dummy output line.

18. The display device of claim 17, wherein the dummy sensing unit detects a driving current that varies depending on driving time, light or temperature.

19. The display device of claim 11, wherein each of the plurality of sensing units comprises a thin film transistor.

* * * * *